United States Patent
Hasegawa (10) Patent No.: US 9,143,665 B2
(45) Date of Patent: Sep. 22, 2015

(54) SOLID-STATE IMAGE SENSOR AND CAMERA

(71) Applicant: CANON KABUSHIKI KAISHA, Tokyo (JP)

(72) Inventor: Shin Hasegawa, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/860,309

(22) Filed: Apr. 10, 2013

(65) Prior Publication Data

US 2013/0286268 A1 Oct. 31, 2013

(30) Foreign Application Priority Data

Apr. 27, 2012 (JP) ................. 2012-103831

(51) Int. Cl.
*H04N 5/225* (2006.01)
*H01L 27/146* (2006.01)
*H04N 5/374* (2011.01)
*H04N 5/335* (2011.01)

(52) U.S. Cl.
CPC ........ *H04N 5/2253* (2013.01); *H01L 27/14618* (2013.01); *H04N 5/335* (2013.01); *H04N 5/374* (2013.01); *H01L 2924/0002* (2013.01)

(58) Field of Classification Search
CPC .............. H04N 5/2253; H04N 5/374
USPC .................. 348/294, 302, 373, 374
See application file for complete search history.

(56) References Cited

U.S. PATENT DOCUMENTS

| | | | |
|---|---|---|---|
| 2004/0090549 A1* | 5/2004 | Takizawa et al. | 348/340 |
| 2006/0017815 A1* | 1/2006 | Stavely et al. | 348/208.7 |
| 2010/0194974 A1* | 8/2010 | Hoshikawa | 348/373 |

FOREIGN PATENT DOCUMENTS

| | | |
|---|---|---|
| JP | 01-303745 A | 12/1989 |
| JP | 2006-229043 A | 8/2006 |
| JP | 2009-049362 A | 3/2009 |

* cited by examiner

*Primary Examiner* — Paul Berardesca (74) *Attorney, Agent, or Firm* — Fitzpatrick, Cella, Harper & Scinto (57) ABSTRACT

A solid-state image sensor, comprising an image sensor chip including a pixel region where a plurality of pixels are arranged and a peripheral region arranged around the pixel region, and a fixing portion including a substrate which supports the image sensor chip and a joint portion which joins the substrate to an external base, wherein the peripheral region includes a first portion, and a second portion which is smaller in an amount of generated heat than the first portion, the substrate includes a first side and a second side, the first portion is arranged nearer the first side than the second side, the second portion is arranged nearer the second side than the first side, and the joint portion is arranged on the first side of the substrate.

17 Claims, 12 Drawing Sheets

SOLID-STATE IMAGE SENSOR AND CAMERA

BACKGROUND OF THE INVENTION

1. Field of the Invention

The present invention relates to a solid-state image sensor and camera.

2. Description of the Related Art

A solid-state image sensor includes an image sensor chip including a pixel region where a plurality of pixels are arranged and a processing unit which processes a pixel signal from the pixel region. The solid-state image sensor generates heat when, for example, the signal processing unit processes a pixel signal. The heat may generate noise in the pixel region and degrade the image quality.

Japanese Patent Laid-Open No. 2009-49362 discloses an arrangement in which an accommodating hole 201 is formed in a substrate 20 to which an image sensor chip 21 is fixed, and a heat sink 22 is arranged in the accommodating hole 201 which contacts the image sensor chip 21. Heat generated in the image sensor chip 21 is dissipated via the heat sink 22.

When the image sensor chip has a portion where the amount of generated heat is locally large, a nonuniform heat distribution is generated in the pixel region, and as a result, the acquired image data may become nonuniform. Japanese Patent Laid-Open No. 2009-49362 does not consider how to uniform the heat distribution.

SUMMARY OF THE INVENTION

The present invention provides a solid-state image sensor advantageous for uniforming a heat distribution in an image sensor chip, and a camera to which the solid-state image sensor is applied.

One of the aspects of the present invention provides a solid-state image sensor, comprising an image sensor chip including a pixel region where a plurality of pixels are arranged and a peripheral region arranged around the pixel region, and a fixing portion including a substrate which supports the image sensor chip and a joint portion which joins the substrate to an external base, wherein the peripheral region includes a first portion, and a second portion which is smaller in an amount of generated heat than the first portion, the substrate includes a first side and a second side, the first portion is arranged nearer the first side than the second side, the second portion is arranged nearer the second side than the first side, and the joint portion is arranged on the first side of the substrate.

Further features of the present invention will become apparent from the following description of exemplary embodiments with reference to the attached drawings.

DESCRIPTION OF THE EMBODIMENTS

<First Embodiment>

Figure 1A:
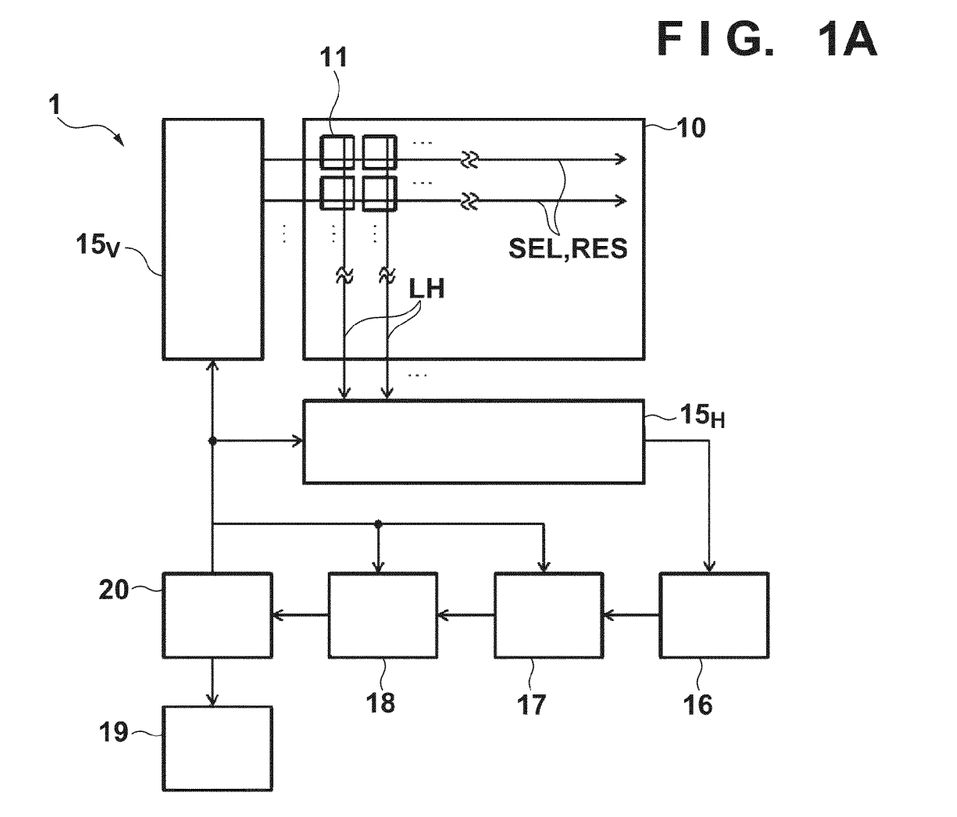
FIGS. 1A and 1B are views for explaining an example of the arrangement of a solid-state image sensor.
Figure 1B:
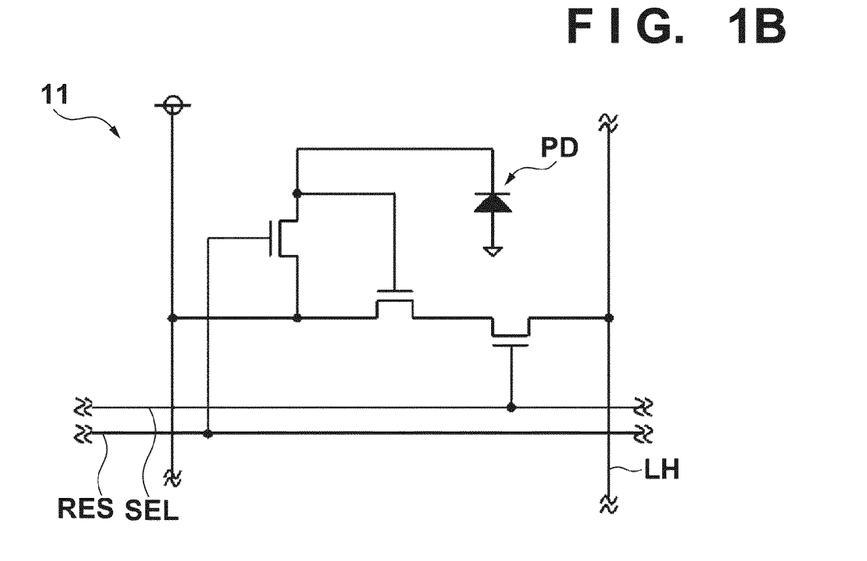

A solid-state image sensor 1 according to the first embodiment will be explained with reference to FIGS. 1A to 6C. FIG. 1A is a block diagram for explaining an example of the arrangement of the solid-state image sensor 1. The solid-state image sensor 1 includes a pixel region 10, a vertical scanning circuit $15_V$, a horizontal scanning circuit $15_H$, a readout unit 16, an amplifier unit 17, a conversion unit 18, an output unit 19, and a control unit 20 which controls them. In the pixel region 10, a plurality of pixels 11 are arranged to form a plurality of rows and a plurality of columns. FIG. 1B exemplifies the circuit arrangement of the unit pixel 11. The pixel 11 can be configured using a photodiode PD and a plurality of transistors. The pixel 11 accumulates charges generated when light enters the photodiode PD, and outputs a signal (pixel signal) corresponding to the accumulated charges to a column signal line LH via the plurality of transistors.

The vertical scanning circuit $15_V$ selects a row of the pixels 11 to be driven in the pixel region 10 in accordance with, for example, a control signal SEL. Also, the vertical scanning circuit $15_V$ selects a row of the pixels 11 to be initialized in the pixel region 10 in accordance with, for example, a control signal RES. The horizontal scanning circuit $15_H$ transfers respective pixel signals output from the plurality of pixels 11 via the column signal lines LH to the readout unit 16 via a signal line. The readout unit 16 can read out the pixel signals from the plurality of pixels 11. The amplifier unit 17 can amplify the readout pixel signal. The conversion unit 18 can convert the pixel signal amplified by the amplifier unit 17 from an analog signal into a digital signal. The solid-state image sensor 1 acquires image data in this manner, and outputs it from, for example, the output unit 19 to a display unit (not shown) or the like.

Figure 2A:
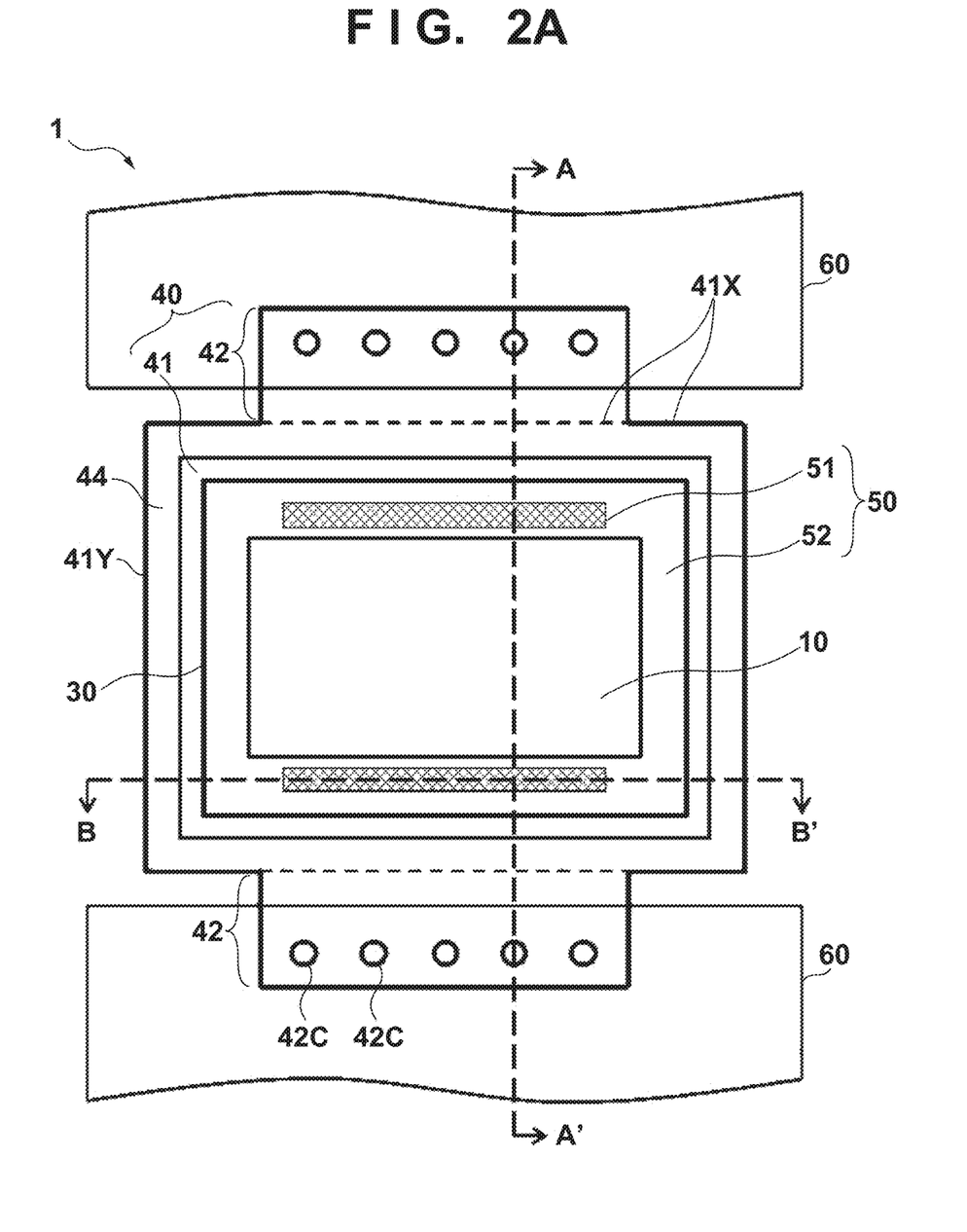
FIGS. 2A to 2C are views for explaining an example of the arrangement of the solid-state image sensor according to the first embodiment.
Figure 2B:
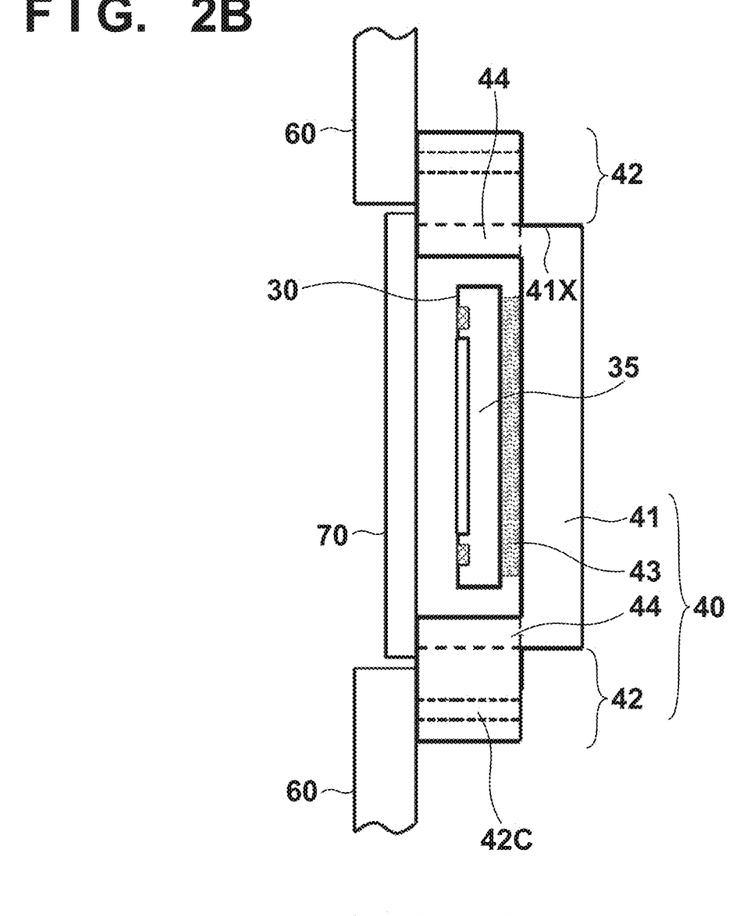
Figure 2C:
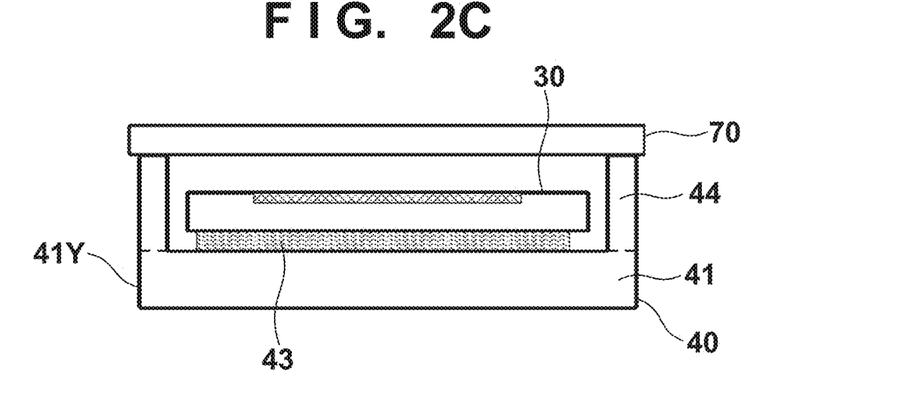

The structure of the solid-state image sensor 1 will be exemplified with reference to FIGS. 2A to 2C. FIG. 2A is a plan view of the solid-state image sensor 1. FIG. 2B is a sectional view of the solid-state image sensor 1 taken along a cut line A-A'. FIG. 2C is a sectional view of the solid-state image sensor 1 taken along a cut line B-B'. The solid-state image sensor 1 includes an image sensor chip 30 and fixing portion 40. The image sensor chip 30 has, on a semiconductor substrate 35, the pixel region 10 and a peripheral region 50 arranged around the pixel region 10. The outer edge of the image sensor chip 30 when viewed from above is represented by a rectangle. The fixing portion 40 attaches the image sensor chip 30 to holding portions 60. With this structure, the holding portions 60 hold the image sensor chip 30.

The fixing portion 40 includes a substrate 41 for holding the image sensor chip 30, and joint portions 42 for joining the substrate 41 to the holding portions 60. For the substrate 41, a material advantageous for conducting heat, such as alumina, aluminum nitride, or a ceramic material such as SiC is preferably used, and especially a ceramic material having a high heat conductivity is preferably used. As exemplified in FIGS. 2A to 2C, the fixing portion 40 can include an adhesive member 43 which is interposed between the substrate 41 and the image sensor chip 30 and adheres them. The adhesive member 43 contains, for example, an adhesive containing, for example, an epoxy resin or silicone resin. The adhesive member 43 may contain a filler such as silver, which increases the heat conductivity of the adhesive member 43.

As exemplified in FIGS. 2A to 2C, the fixing portion 40 may include a support portion 44 which is formed at the periphery of the fixing portion 40 to support a transparent member 70 (containing glass, quartz, or the like). The support portion 44 may be arranged along the periphery of the substrate 41 to surround the image sensor chip 30, or arranged around part of the image sensor chip 30. The support portion 44 and substrate 41 may be integrated, or the support portion 44 and joint portions 42 may be integrated. For example, the fixing portion 40 can be formed by arranging a frame-shaped member including the joint portions 42 and support portion 44 on the substrate 41. The embodiment adopts an arrangement in which a frame-shaped member including the joint portions 42 and support portion 44 is interposed between the substrate 41 and the transparent member 70. A ceramics or the like can be used for the substrate 41. A metal or resin advantageous for conducting heat can be used for the support portion 44. For example, a stainless steel such as SUS430 or SUS304, a copper alloy, an aluminum alloy, an iron-nickel alloy, a metal having a high heat conductivity such as Kovar, or a resin having a high heat conductivity is satisfactorily used. In particular, alloy 42 (iron alloy containing 42% nickel), alloy 426 (iron alloy containing 42% nickel and 6% chromium), and Kovar (iron alloy containing 29% nickel and 17% cobalt) are advantageous in manufacturing because their coefficients of linear expansion are low. The holding portions 60 are positioned on the side of the transparent member 70, but may be positioned on the side of the substrate 41 (side of the joint portions 42 opposite to the transparent member 70).

The peripheral region 50 includes first portions 51 and second portions 52. In the peripheral region 50, the first portions 51 include functional blocks such as the signal processing unit and calculation unit which generate a relatively large amount of heat. The second portions 52 include functional blocks which generate a relatively small amount of heat. That is, the first portion 51 is larger in the amount of generated heat than the second portion 52. In the embodiment, for example, the readout unit 16, amplifier unit 17, or conversion unit 18 corresponds to the first portion 51. The amount of generated heat can be appropriately calculated based on the circuit scale of the target portion, the driving time, the driving frequency, the driving current consumption, and the like. In this case, the two first portions 51 are arranged along the long sides of the image sensor chip 30 to sandwich the pixel region 10.

The substrate 41 has first sides 41X and second sides 41Y. The first portion 51 is arranged near the first side 41X out of the first side 41X and second sides 41Y. The second portion 52 is arranged near at least the second side 41Y out of the first side 41X and second side 41Y. That is, the first portion is arranged nearer the first side than the second side, and the second portion is arranged nearer the second side than the first side. The joint portion 42 is arranged on the first side 41X of the substrate 41. The fixing portion 40 suffices to have a shape advantageous for fixing the image sensor chip 30 to the holding portions 60. In the embodiment, the fixing portion 40 has a shape which protrudes in directions parallel to surfaces in contact with the holding portions 60 so as to increase the areas by which the joint portions 42 contact the holding portions 60. This can increase the heat conductance at portions where the fixing portion 40 contacts the holding portions 60. Each joint portion 42 has threaded holes 42C. The image sensor chip 30 can be fixed to the holding portions 60 via the joint portions 42 of the fixing portion 40. This fixing is achieved by clamping using screws, but may be achieved by using an adhesive or welding a metal. In this fashion, the fixing portion 40 is configured so that the heat conductance from the first portion 51 to the holding portion 60 becomes higher than that from the second portion 52 to the holding portion 60. While heat generated at the first portion 51 is effectively dissipated, heat generated at the second portion 52 is hardly dissipated, compared to the heat generated at the first portion 51.

Figure 3:
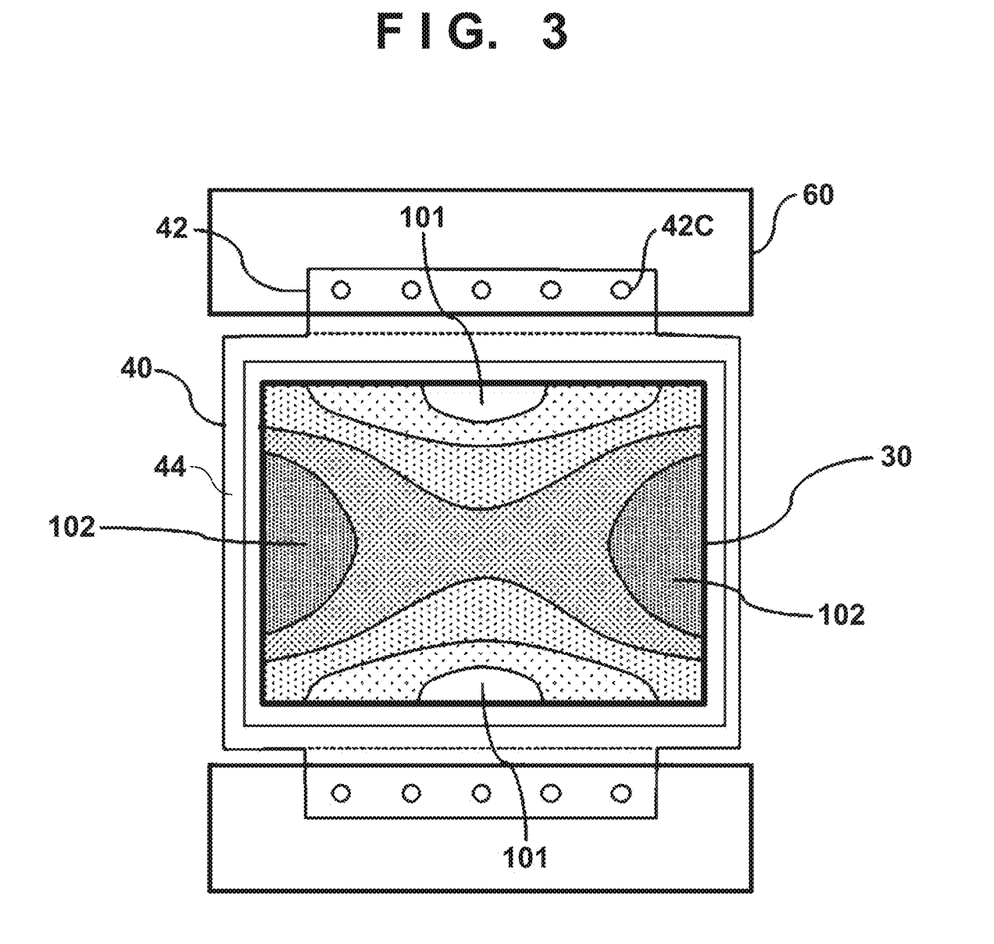
FIG. 3 is a view for explaining a simulation result according to the first embodiment.

The simulation result of the temperature distribution of the solid-state image sensor 1 will be described with reference to FIG. 3. The simulation was performed using a solid-state image sensor 1 of the APS-C size. 1.2 mm-thick alumina ceramic was used as the substrate 41, 20 µm-thick silicone resin was used as the adhesive member 43, 1.2 mm-thick SUS430 was used as the joint portion 42 and support portion 44, and 0.5 mm-thick glass was used as the transparent member 70. FIG. 3 shows the simulation result of the temperature distribution of the image sensor chip 30 when the amount of generated heat at the first portion 51 is defined as 1 W. In FIG. 3, lines which separate shades are contour lines at every 0.1° C. A region 101 represents a portion where the temperature was highest in the image sensor chip 30 in the simulation result, and a region 102 represents a portion where the temperature was lowest. The temperature difference between the regions 101 and 102 was 0.5° C.

Figure 4A:
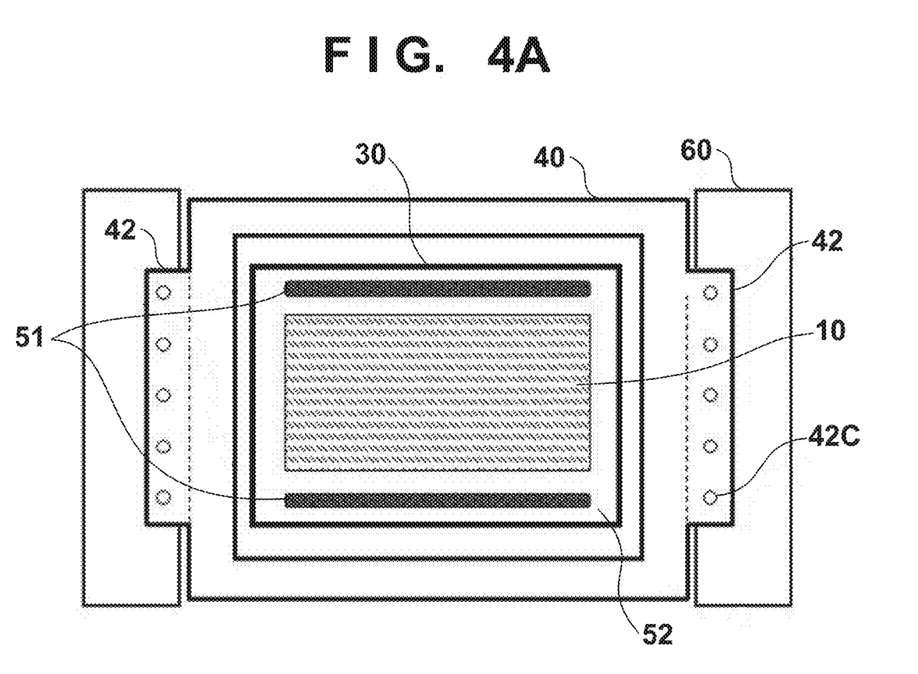
FIGS. 4A and 4B are views for explaining a simulation result as a comparison example.
Figure 4B:
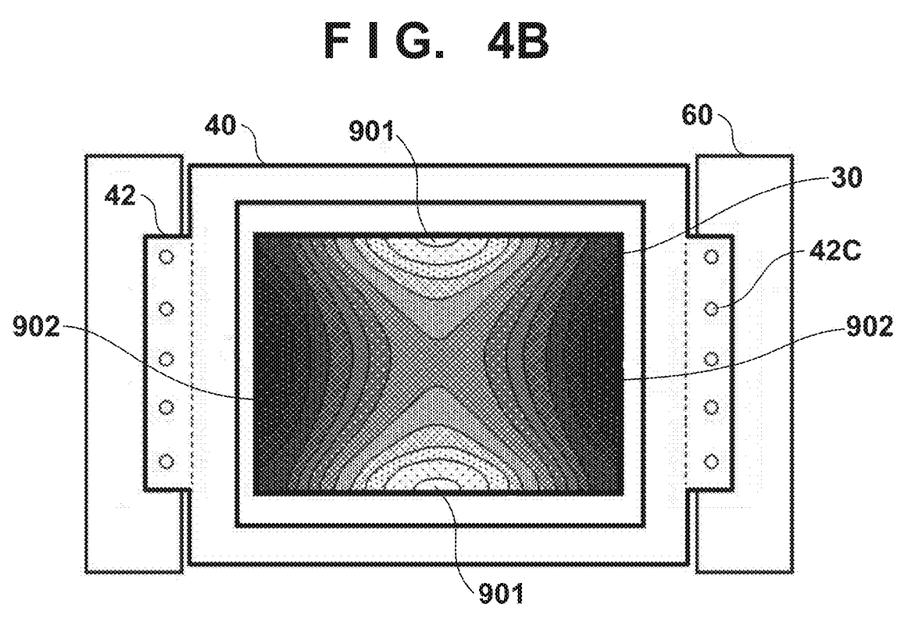

FIG. 4A is a front view showing, as a reference example, a case in which the joint portions 42 are arranged along the second sides 41Y of the substrate 41. FIG. 4B shows a simulation result in this case. A region 901 represents a portion where the temperature was highest in the image sensor chip 30, and a region 902 represents a portion where the temperature was lowest. The temperature difference between the regions 901 and 902 was 1.4° C.

As is apparent from these simulation results, in the solid-state image sensor 1, heat generated at the first portion 51 is effectively dissipated, whereas heat generated at the second portion 52 is hardly dissipated compared to the heat generated at the first portion 51. In this way, the solid-state image sensor 1 uniforms a nonuniform heat distribution generated in the image sensor chip 30. The nonuniform temperature distribution described here stands out in, for example, a large-size solid-state image sensor of the 35-mm full size or the like. However, the above arrangement is not limited to the large-size solid-state image sensor, and is widely applicable.

As exemplified above, the fixing portion 40 is configured so that the heat conductance from the first portion 51 to the holding portion 60 becomes higher than that from the second portion 52 to the holding portion 60. While heat generated at the first portion 51 is effectively dissipated, heat generated at the second portion 52 is hardly dissipated, compared to the heat generated at the first portion 51. Therefore, the solid-state image sensor 1 is advantageous for uniforming a heat distribution in the image sensor chip 30. Note that, the heat conductance is defined as the reciprocal of the thermal resistance, so the heat conductance may be gained by measuring the thermal resistance. The thermal resistance is the difficulty of heat transfer, and shows an amount of temperature change [deg C.] for amount of heat generation [W] per time unit. For example, shown in FIGS. 2A to 2C, a heat source such as ceramic heater is arranged on the semiconductor substrate 35, and produces heat. Let $W_H$ be the amount of heat generation of the heat source. The heat is transferred to the holding portions 60, through the semiconductor substrate 35, the adhesive member 43, the substrate 41 and the frame-shaped member including the joint portions 42 and the support portion 44, in this order. Let $T_{Si}$ be the temperature of the semiconductor substrate 35 at the moment, and let $T_{HS}$ be the temperature of the holding portions 60, then the thermal resistance will be $(T_{Si}-T_{HS})/W_H$. In this way, the thermal resistance and the heat conductance may be measured.

Figure 5A:
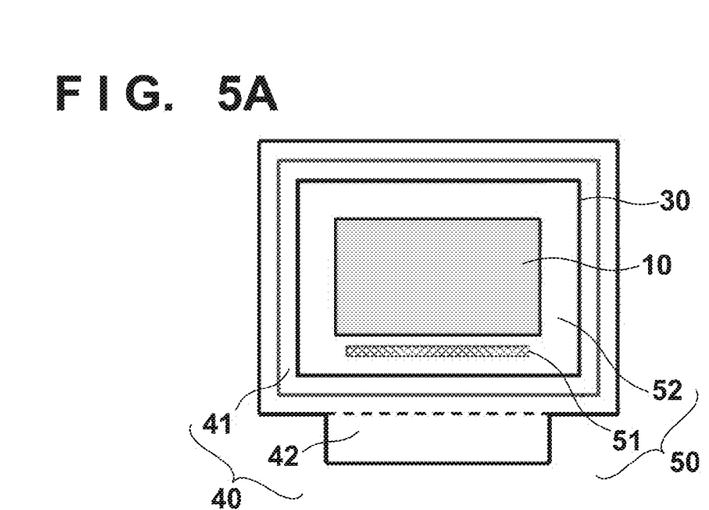
FIGS. 5A to 5G are views for explaining other examples of the arrangement.
Figure 5B:
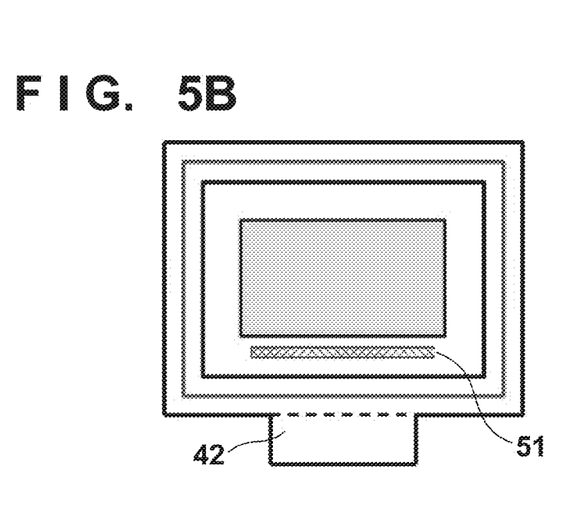
Figure 5C:
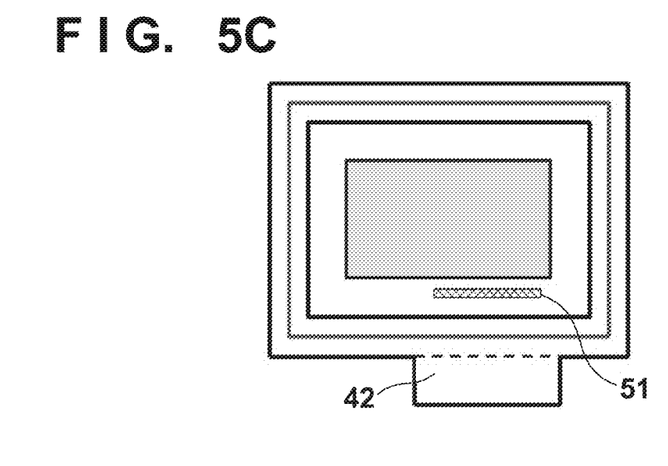
Figure 5D:
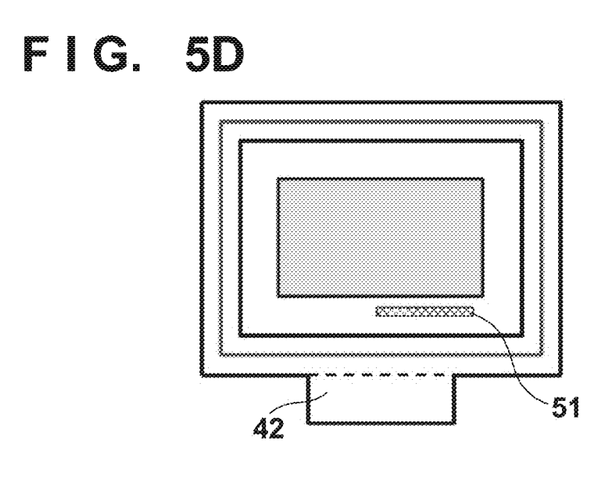
Figure 5E:
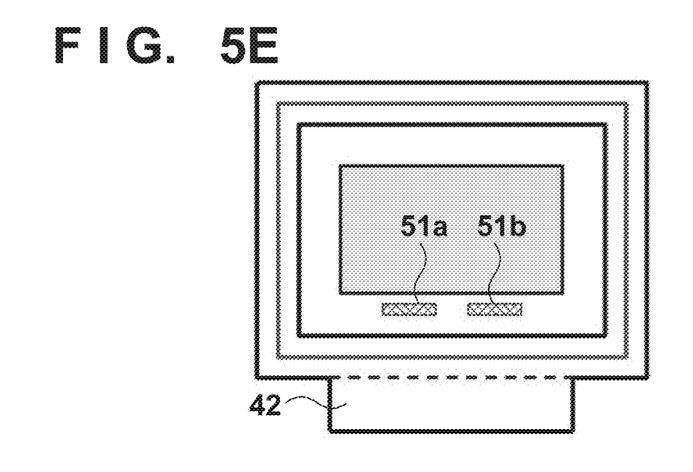
Figure 5F:
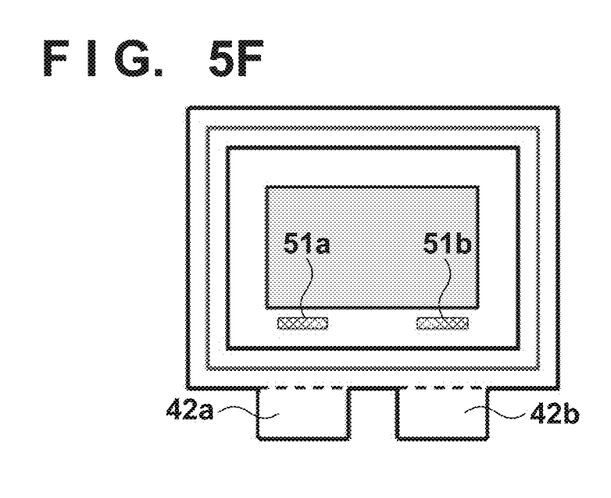
Figure 5G:
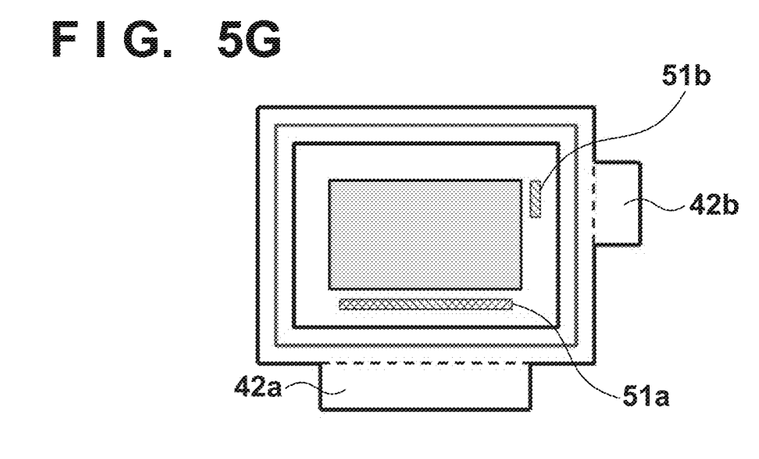

FIGS. 5A to 5G show other examples of the arrangement of the fixing portion 40, particularly, detailed examples of the positional relationship between the joint portion 42 and the first portion 51. In FIGS. 5A to 5G, similar to the above description, the outer edge of the image sensor chip 30 when viewed from above is represented by a rectangle. FIGS. 5A to 5D show cases in each of which one first portion 51 is arranged along the long side of the image sensor chip 30. The joint portion 42 is arranged on a side of the substrate 41 to which the first portion 51 is close. FIG. 5A shows a case in which the joint portion 42 is longer than the first portion 51 in a direction parallel to the first side 41X. A portion of the first side 41X at which the joint portion 42 is arranged includes a portion to which the first portion 51 out of the first portion 51 and second portion 52 is arranged close. FIG. 5B shows a case in which the joint portion 42 is shorter than the first portion 51 and is arranged close to part of the first portion 51. FIG. 5C shows a case in which the first portion 51 is shorter than those in FIGS. 5A and 5B and the positional relationship between the joint portion 42 and the first portion 51 is the same as that in the case of FIG. 5A. FIG. 5D shows a case in which part of the joint portion 42 is arranged close to part of the first portion 51. FIGS. 5E and 5F show cases in each of which two first portions 51a and 51b are arranged along one long side of the image sensor chip 30 and the joint portion 42 is arranged on this long side. FIG. 5E shows a case in which one joint portion 42 is arranged close to the entire portions of the two first portions 51a and 51b. FIG. 5F shows a case in which the two first portions 51a and 51b are arranged apart from each other and two joint portions 42a and 42b are arranged apart from each other. In this case, the joint portion 42a is arranged close to the entire portion of the first portion 51a, and the joint portion 42b is arranged close to the entire portion of the first portion 51b. FIG. 5G shows a case in which one of the two first portions 51a and 51b is arranged along one long side of the image sensor chip 30, and the other one of the first portions 51a and 51b is arranged along one short side of the image sensor chip 30. One (the joint portion 42a in this case) of the two joint portions 42a and 42b is arranged on the long side to which the first portion 51a is close, and the other (the joint portion 42b in this case) is arranged on the short side to which the first portion 51b is close. One of the above-exemplified structures may be applied to the fixing portion 40. In particular, as the portion where the joint portion 42 and first portion 51 are close to each other is larger, the fixing portion 40 can more effectively dissipate heat generated at the first portion 51.

Figure 6A:
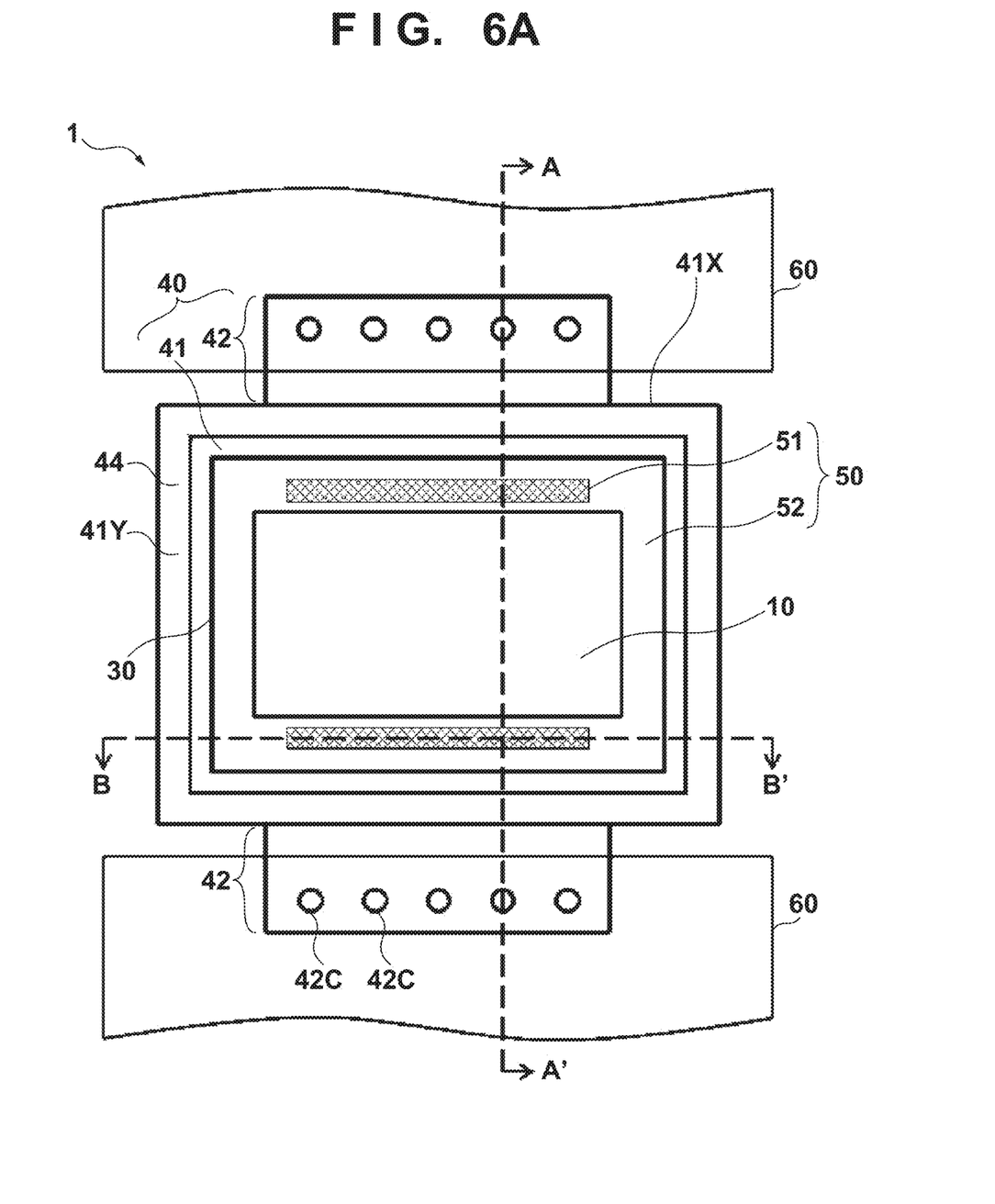
FIGS. 6A to 6C are views for explaining another example of the arrangement.
Figure 6B:
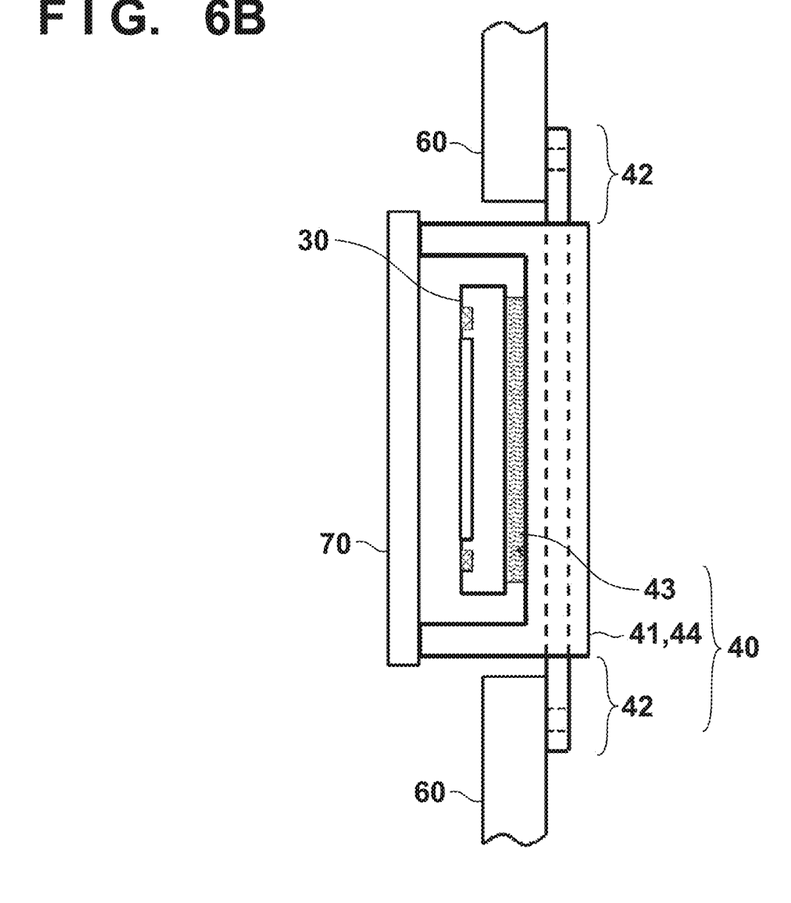
Figure 6C:
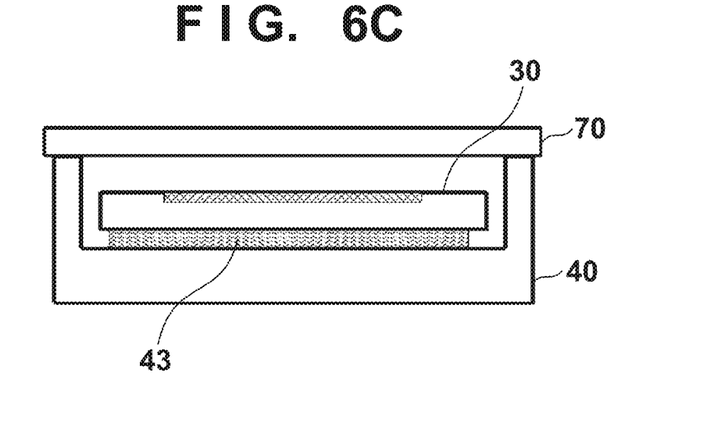

Further, as exemplified in FIGS. 6A to 6C, the fixing portion 40 may be configured so that the substrate 41 and support portion 44 are made of a resin containing an epoxy resin or the like, and the joint portions 42 are formed to extend through the inside of the substrate 41. Similar to FIGS. 2A to 2C, FIG. 6A is a plan view of the solid-state image sensor 1, FIG. 6B is a sectional view taken along a cut line A-A', and FIG. 6C is a sectional view taken along a cut line B-B'. Reference numerals used in FIGS. 6A to 6C denote the same parts as those described above. The joint portions 42 are arranged on the first sides 41X of the substrate 41 in the aforementioned manner. Even with this arrangement, the solid-state image sensor 1 can efficiently obtain the above-described effects.

<Second Embodiment>

Figure 7A:
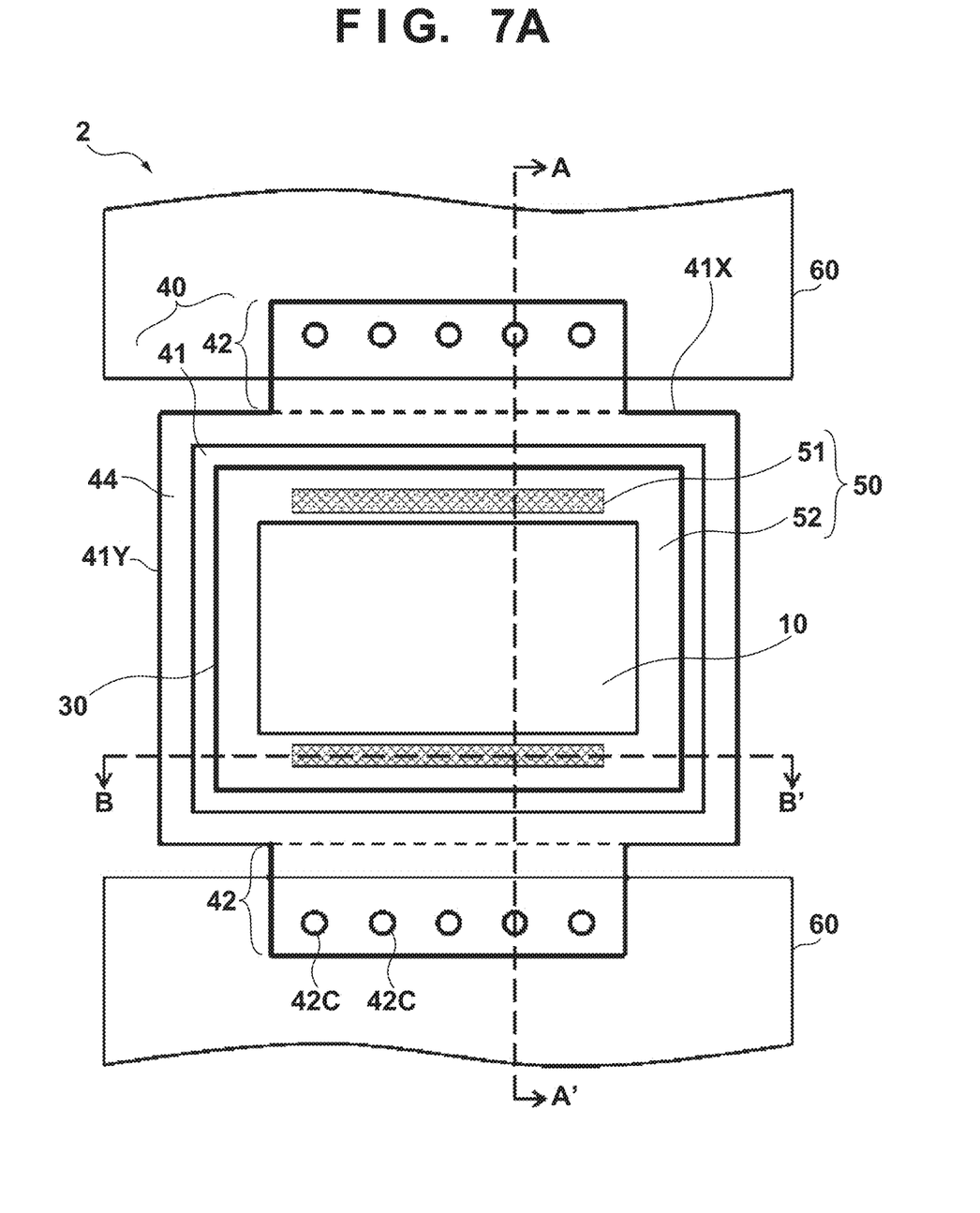
FIGS. 7A to 7C are views for explaining an example of an arrangement according to the second embodiment.
Figure 7B:
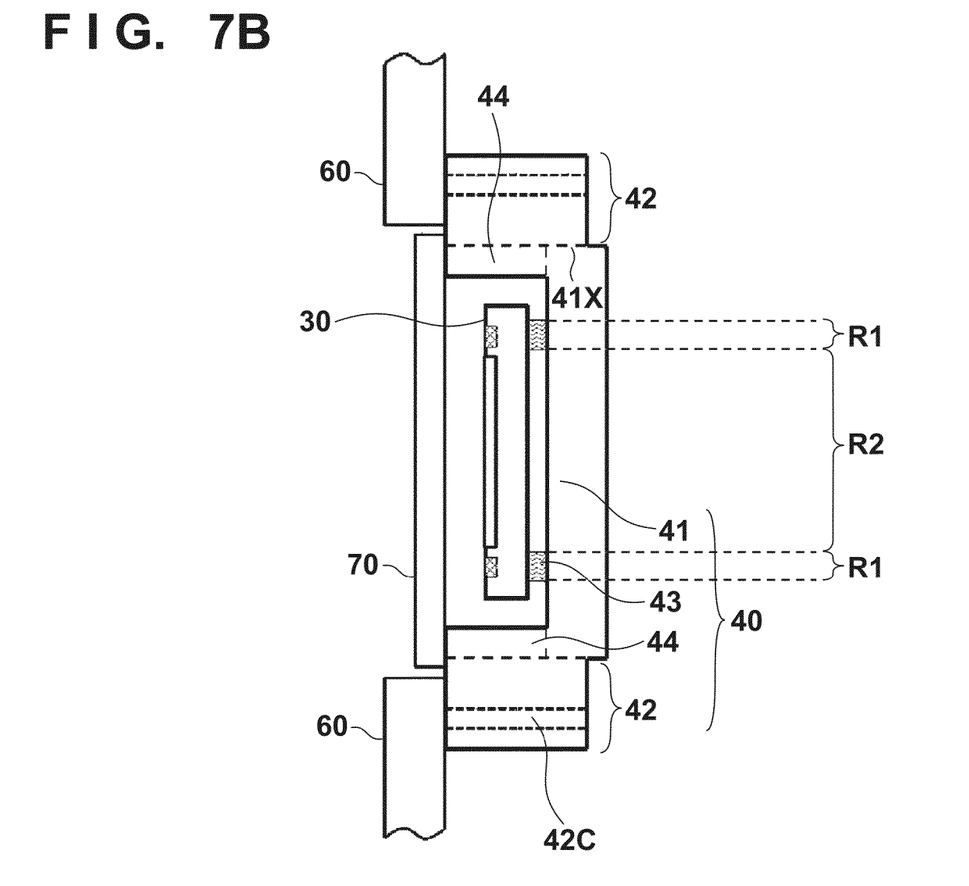
Figure 7C:
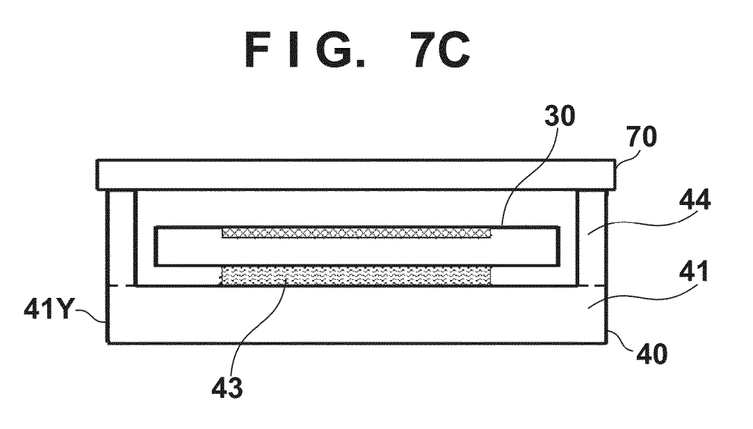

A solid-state image sensor 2 according to the second embodiment will be explained with reference to FIGS. 7A to 8. Similar to FIGS. 2A to 2C or 6A to 6C, FIG. 7A is a plan view of the solid-state image sensor 2, FIG. 7B is a sectional view taken along a cut line A-A', and FIG. 7C is a sectional view taken along a cut line B-B'. The solid-state image sensor 2 is different from the first embodiment in that a fixing portion 40 further includes a first region $R_1$ and second region $R_2$ between a substrate 41 and an image sensor chip 30. The first region $R_1$ and second region $R_2$ are regions different from each other. The remaining reference numerals used in FIGS. 7A to 7C denote the same parts as those in the first embodiment. In the first embodiment, the joint portion 42 and support portion 44 have the same thickness. However, as exemplified in FIGS. 7A to 7C, a joint portion 42 and support portion 44 may have different thicknesses. The first region $R_1$ is larger in heat conductivity than the second region $R_2$. In the first region $R_1$, an adhesive member 43 for adhering the substrate 41 and image sensor chip 30 is arranged. That is, the adhesive member 43 is included in the fixing portion 40 so that it is selectively interposed between the substrate 41 and the image sensor chip 30. A member lower in heat conductivity than the adhesive member 43 may be arranged in the second region $R_2$, or the second region $R_2$ may be a space (cavity), as shown in FIG. 7B.

The first region $R_1$ is arranged close to a first portion 51 out of the first portion 51 and a second portion 52. The second region $R_2$ is arranged close to the second portion 52 out of the first portion 51 and second portion 52. While heat generated at the first portion 51 is effectively dissipated, heat generated at the second portion 52 is hardly dissipated, compared to the heat generated at the first portion 51. Accordingly, the temperature distribution of the image sensor chip 30 can be more effectively uniformed.

Figure 8:
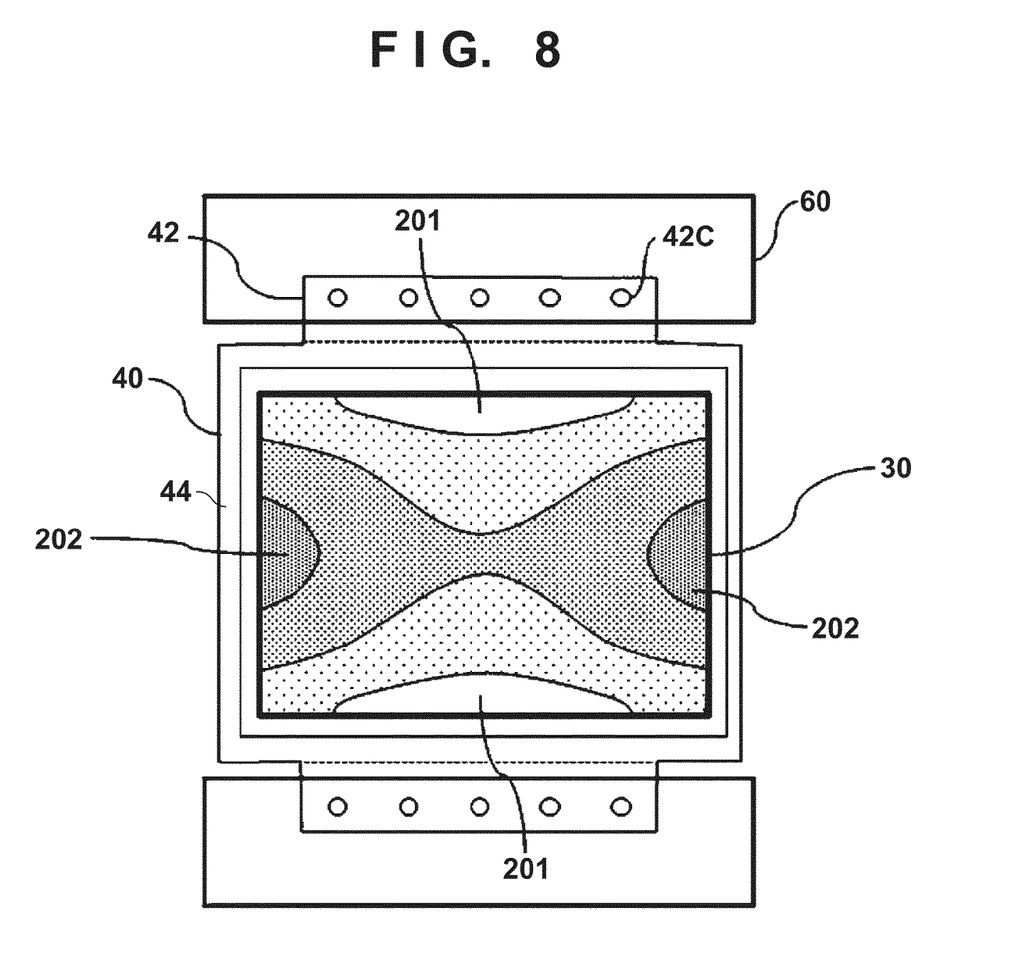
FIG. 8 is a view for explaining a simulation result according to the second embodiment.

FIG. 8 shows the simulation result of the temperature distribution of the image sensor chip 30 in the solid-state image sensor 2, similar to the first embodiment. A region 201 represents a portion where the temperature was highest in the image sensor chip 30 in the simulation result, and a region 202 represents a portion where the temperature was lowest. The temperature difference between the regions 201 and 202 was 0.4° C. From this, the second embodiment further enhances the effect of uniforming the temperature distribution of the image sensor chip 30, compared to the first embodiment (the temperature difference between the regions 101 and 102 is 0.5° C.). The solid-state image sensor 2 is further advantageous for uniforming a heat distribution in the image sensor chip 30.

The two embodiments have been described. However, the present invention is not limited to them, properly allows changes of the purpose, state, application, function, and other specifications, and can be practiced by another embodiment. For example, the pixel region is configured as a CMOS image sensor, but any other sensor may be used. For example, the order of amplification, analog-to-digital conversion, and the like for a pixel signal in the arrangement exemplified in FIG. 1A may be changed, and the present invention is not limited to this arrangement. The outer edge of the image sensor chip in the plan view is represented by a rectangle, but the outer edge may have a shape including a square, polygon, or curve, or a circle. The solid-state image sensor incorporated in a camera has been described. However, the concept of the camera is not limited to an apparatus whose main purpose is image capturing, but also includes an apparatus (for example, a personal computer or mobile terminal) accessorily having the image capturing function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103831, filed Apr. 27, 2012, which is hereby incorporated by reference herein in its entirety.

What is claimed is:

1. A solid-state image sensor comprising:
an image sensor chip including a pixel region where a plurality of pixels are arranged, and a peripheral region arranged around the pixel region; and
a fixing portion including a substrate which supports the image sensor chip,
wherein the image sensor chip and a base are fixed by the fixing portion,
wherein the peripheral region includes a first portion, and a second portion which is smaller in an amount of generated heat than the first portion,
the substrate includes a first side and a second side,
the first portion is arranged nearer the first side than the second side,
the second portion is arranged nearer the second side than the first side, and
the fixing portion has a joint portion arranged on the first side of the substrate which joins the substrate and the base, and the fixing portion does not have a joint portion arranged on the second side of the substrate which joins the substrate and the base.

2. The sensor according to claim 1, wherein
the fixing portion further includes a first region and a second region between the substrate and the image sensor chip,
the first region is higher in heat conductivity than the second region,
the first region is arranged close to at least the first portion out of the first portion and the the second portion, and
the second region is arranged close to at least the second portion out of the first portion and the second portion.

3. The sensor according to claim 2, wherein the second region includes a cavity.

4. The sensor according to claim 1, wherein
the joint portion is longer than the first portion in a direction parallel to the first side, and
a portion of the first side at which the joint portion is arranged, includes a portion to which the first portion is arranged closer than the second portion.

5. The sensor according to claim 1, wherein the joint portion contacts the base.

6. A solid state image sensor comprising:
an image sensor chip including a pixel region where a plurality of pixels are arranged, and a peripheral region arranged around the pixel region;
a transparent member which transmits light entering the image sensor chip;
a fixing portion including a substrate which supports the image sensor chip, and a support portion which is interposed between the transparent member and the substrate to support the transparent member, the fixing portion fixing the image sensor chip and a base, wherein
the peripheral region includes a first portion, and a second portion which is smaller in an amount of generated heat than the first portion,
the substrate includes a first side and a second side,
the first portion is arranged nearer the first side than the second side,
the second portion is arranged nearer the second side than the first side, and
the fixing portion has a joint portion arranged on the first side of the substrate which joins the substrate and the base, and the fixing portion does not have a joint portion arranged on the second side of the substrate which joins the substrate and the base.

7. The sensor according to claim 6, wherein the support portion and the joint portion are integrated and formed from a material different from a material of the substrate.

8. The sensor according to claim 1, wherein the first portion includes at least one of a readout unit which reads out pixel signals from the plurality of pixels, an amplifier unit which amplifies the pixel signals, and a conversion unit which converts the pixel signals from analog signals into digital signals.

9. A camera comprising a solid-state image sensor defined in claim 1, wherein the solid-state image sensor is fixed by a fixing portion.

10. A solid-state image sensor comprising:
an image sensor chip including a pixel region where a plurality of pixels are arranged, and a peripheral region arranged around the pixel region; and
a fixing portion, including a substrate for supporting the image sensor chip, wherein the image sensor chip and a base are fixed by the fixing portion,
wherein the peripheral region includes a first portion and a second portion,
the first portion is larger in an amount of generated heat than the second portion, and
the substrate includes a first side and a second side,
the first portion is arranged nearer the first side than the second side,
the second portion is arranged nearer the second side than the first side,
the fixing portion has a joint portion arranged on the first side of the substrate which joins the substrate and the base, and the fixing portion does not have a joint portion arranged on the second side of the substrate which joins the substrate and the base.

11. A camera comprising a solid-state image sensor defined in claim 10, wherein the solid-state image sensor is fixed by a fixing portion.

12. The sensor according to claim 1, wherein the joint portion includes a hole for clamping the joint portion and the external base to each other by a screw.

13. The sensor according to claim 6, wherein the joint portion includes a hole for clamping the joint portion and the external base to each other by a screw.

14. The sensor according to claim 10, wherein the fixing portion includes a hole for clamping the fixing portion and the external base to each other by a screw.

15. A solid-state image sensor comprising:
an image sensor chip including a pixel region where a plurality of pixels are arranged, and a peripheral region arranged around the pixel region; and
a fixing portion including a substrate which supports the image sensor chip, the fixing portion fixing the image sensor chip and a base, wherein
the peripheral region includes a first portion and a second portion which is smaller in an amount of generated heat than the first portion,
the substrate includes a first edge and a second edge,
the first portion is arranged nearer the first edge than the second edge,
the second portion is arranged nearer the second edge than the first edge, and
the joint portion is arranged on the first edge of the substrate the fixing portion has a joint portion arranged on the first side of the substrate which joins the substrate and the base, and the fixing portion does not have a joint portion arranged on the second side of the substrate which joins the substrate and the base.

16. The sensor according to claim 2, wherein the first portion entirely overlaps with the first region in a direction perpendicular to an upper face of the image sensor chip.

17. A solid state image sensor comprising:
an image sensor chip including a pixel region where a plurality of pixels are arranged and a peripheral region arranged around the pixel region;
a fixing portion including a substrate which supports the image sensor chip and a joint portion which joins the substrate to an external base; and
a transparent member which transmits light entering the image sensor chip, wherein
the peripheral region includes a first portion, and a second portion which is smaller in an amount of generated heat than the first portion,
the substrate includes a first side and a second side,
the first portion is arranged nearer the first side than the second side,
the second portion is arranged nearer the second side than the first side,
the joint portion is arranged on the first side of the substrate,
the fixing portion further includes a support portion which is interposed between the transparent member and the substrate to support the transparent member, and
the support portion and the joint portion are integrated and formed from a material different from a material of the substrate.

* * * * *